United States Patent [19]

Kolm et al.

[11] 4,435,667

[45] Mar. 6, 1984

[54] SPIRAL PIEZOELECTRIC ROTARY ACTUATOR

[75] Inventors: Henry H. Kolm, Wayland; Eric A. Kolm, Brookline, both of Mass.

[73] Assignee: Peizo Electric Products, Inc., Cambridge, Mass.

[21] Appl. No.: 372,636

[22] Filed: Apr. 28, 1982

[51] Int. Cl.³ .......................................... H04R 17/00
[52] U.S. Cl. .................................. 310/367; 310/330; 310/333; 310/355; 310/800
[58] Field of Search ............... 310/328, 330, 332, 345, 310/358, 367, 369, 800, 355; 200/181

[56] References Cited

U.S. PATENT DOCUMENTS

| | | | |
|---|---|---|---|
| 2,497,108 | 2/1950 | Williams | 310/367 |
| 3,781,955 | 1/1974 | Lavrinenko et al. | 310/330 |
| 3,900,748 | 8/1975 | Adler | 310/333 |
| 4,330,593 | 5/1982 | Shrout et al. | 310/358 |

FOREIGN PATENT DOCUMENTS 2811524  9/1979  Fed. Rep. of Germany ...... 310/355

*Primary Examiner*—J. D. Miller
*Assistant Examiner*—D. L. Rebach
*Attorney, Agent, or Firm*—Joseph S. Iandiorio

[57] ABSTRACT

A piezoelectric rotary actuator including: a rotatable member; a spiral member fixed at its inner end to the rotatable member; one or more piezoelectric layers attached on one or both sides of the spiral member; means for rotatably supporting the rotatable member relative to the outer portion of the spiral member; and an electrode for applying a voltage across the piezoelectric layer or layers, to bend the spiral and rotate the rotatable member.

12 Claims, 8 Drawing Figures

SPIRAL PIEZOELECTRIC ROTARY ACTUATOR

FIELD OF INVENTION

This invention relates to a piezoelectric rotary actuator or motor, and more particularly to such a rotary actuator which utilizes a piezoelectric spiral member.

BACKGROUND OF INVENTION

Piezoelectric materials make very efficient and fast-acting electro-mechanical energy converters or transducers. Piezoceramics have been used as transducers for several years, but mostly in a resonant mode. Examples of application include underwater sound transducers for echo ranging and submarine detection, transducers for ultrasonic washing, milling, cutting and welding machines, transducers for medical acoustic imaging devices, sound generators for alarms, and high frequency loudspeakers. There are some applications in which piezoceramics have been used to produce discrete motion rather than oscillatory motion. Due to the very small dimensional change produced in simple piezoelectric bodies, special configurations have been developed for the purpose of achieving the largest possible dimensional change. One type of actuating element is a so-called "stack motor", which is a stack of many individual piezoceramic wafers connected mechanically in series and electrically in parallel so as to generate the largest possible expansion and contraction without the need for unreasonably high voltages. Stack motors are relatively quite expensive. Another type of piezoelectric actuating element developed for achieving large motion is known generally as a "bender" or "bimorph" or "bilam". A bender consists of one or more piezoceramic wafers several mils thick, fired and polarized, and then bonded to a metal support sheet. In symmetric benders, the metal support sheet is along the neutral axis, where neither compression or expansion occurs, and is flanked by two or more piezoceramic wafers, polarized and energized in such a manner that the wafers on one side of the support sheet contract, while those on the other side expand, thereby causing the element to bend when a voltage is applied to its electrodes. Bending motion, however, is limited to a small fraction of the length of the bender, about 20 mils in the case of a bender 1.5 inches long. This limitation is due to the brittleness of the piezoceramic wafers. There is no practical method for producing large motion strokes, in particular large rotary motion strokes, by means of a piezoceramic element. Rotary electric actuators have therefore been of the magnetic type, and magentic motors are vastly less energy-efficient than piezoelectric motors and become increasingly less efficient as they are scaled down to smaller and smaller size.

SUMMARY OF INVENTION

It is therefore an object of this invention to provide an improved, simpler and less expensive rotary actuator.

It is a further object of this invention to provide such a rotary actuator which provides a large-stroke rotary motion.

It is a further object of this invention to provide such a rotary actuator which is highly efficient and may be arbitrarily small in size.

It is a further object of this invention to provide such a rotary actuator which employs a piezoelectric medium.

This invention results from the realization that a truly effective rotary actuator can be constructed using a flexible piezoelectric medium in combination with a spiral member such as a coiled leaf spring which when properly energized may be made to bend into a tighter or more expanded coil and rotate a shaft at its inner end.

The invention features a piezoelectric rotary actuator including a rotatable member and a spiral member fixed at its inner or outer end to the rotatable member. One or more piezoelectric layers are attached to the spiral member and electrode means are provided for applying a voltage across the piezoelectric layer or layers to bend the spiral member and rotate the rotatable member.

In a preferred embodiment, the rotatable member is a shaft and the spiral member is a spring, and more particularly is a leaf spring formed in a coil such as a watch spring. The piezoelectric layer may be made of a granular piezoceramic material in an elastomeric binder. The elastomeric binder may be vinyl. The electrode means may include an electrode on the free side of the piezoelectric layers and the spiral member may be made of electrically conducting material and constitute a common electrode. There may be two or more piezoelectric layers, with electrodes between layers, so that the piezoelectric layers can be connected electrically in parallel for the purpose of keeping the operating voltage at a minimum.

DISCLOSURE OF PREFERRED EMBODIMENT

Other objects, features and advantages will occur from the following description of a preferred embodiment and the accompanying drawings, in which.

The invention may be accomplished with a piezoelectric rotary actuator including a rotatable member such as a shaft and a coil member which includes a spiral member fixed at its inner end to the shaft, and a piezoelectric layer attached on one side to the spiral member. Alternatively, the spiral member may be attached at its inner end to the fixed member and at its outer end to the rotatable member, as is often the construction in clock mechanisms. The spiral member is typically a leaf spring similar to a coil spring or watch spring. The piezoelectric layer is a flexible elastic layer made, for example, by crushing a fired body of piezoceramic material such as lead zirconate-lead titanate, crushing it to granules of one to ten micron size, mixing the granulated piezoceramic with an elastomeric medium such as vinyl, coating the vinyl onto the leaf spring in a layer 0.5 mm thick, applying an electrode coating to the outer surface of the vinyl layer, and the polarizing the layer by applying a voltage of 1,000 volts across the layer in an oil bath.

The coiled leaf spring may act as a second electrode. A voltage applied across the electrode bends the spiral member, either inwardly to contract or outwardly to expand, and rotates the shaft in the clockwise or counterclockwise direction. If the coil spring with the piezoceramic layer has a length of twelve inches, the shaft will rotate through an angle of about forty-five degrees upon the application of about 300 volts across the electrodes. The rotary actuator is useful in many applications; for example as an action for a volt meter it has substantially less resistive loss and substantially higher input impedance than the magnetically driven volt meter movement. It is also less expensive and more rugged than the typical galvanometer movement used in many volt meters.

Figure 1:
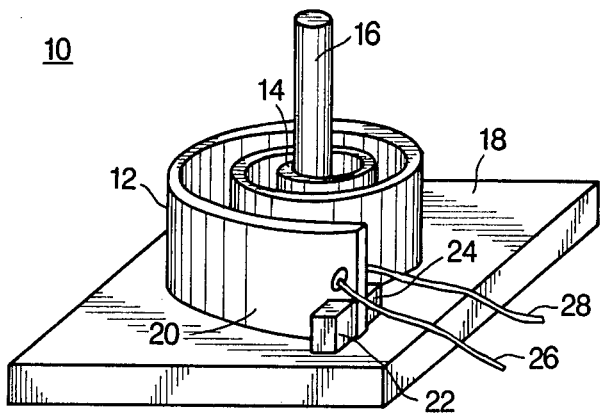
FIG. 1 is an axonometric diagram of a piezoelectric rotary actuator according to this invention.

There is shown in FIG. 1 a piezoelectric rotary actuator 10 according to this invention having a coil member 12 with its inner end 14 fixed to shaft 16 rotatably mounted in support plate 18. Outer end 20 of coil member 12 is fixed by means such as anchor blocks 22, 24 to support plate 18. Coil member 12 is energized to bend to contract and drive shaft 16 in one direction, or to bend and expand and drive shaft 16 in the opposite direction, by a voltage applied to wires 26, 28.

Figure 2:
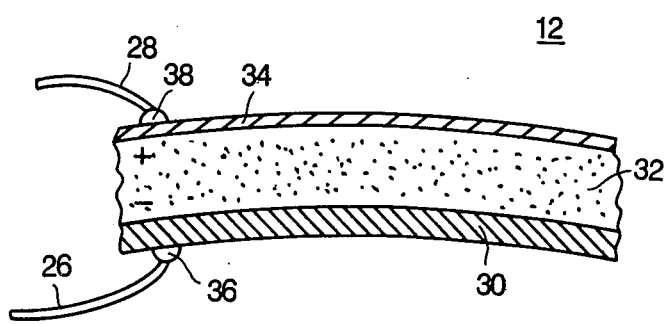
FIG. 2 is an enlarged cross-sectional view of the coil member of FIG. 1.

Coil member 12, FIG. 2, is comprised of a coiled or spiral leaf spring 30, FIG. 2, on which is supported the piezoceramic-vinyl flexible piezoelectric layer 32. An electrode 34 such as silver plating, applied by means of vacuum deposition or electroplating from aqueous solution in a coating 0.0001 inch thick, is applied to the free side of piezoelectric layer 32. Wires 28 and 26 are soldered at 36, 38 to spring 30 and electrode 34. If spring 30 is not a metal or other electrical conducting material, a second electrode may be used between spring 30 and piezoelectric layer 32. With piezoelectric layer 32 polarized as shown with its side toward electrode 34 positive and its slide toward spring 30 negative, a voltage applied to wires 28 and 26 having a positive polarity at wire 28 and a negative polarity at 26, i.e., in the poling direction, causes piezoelectric layer 32 to contract longitudinally, causing the spring member to uncoil.

Figure 3:
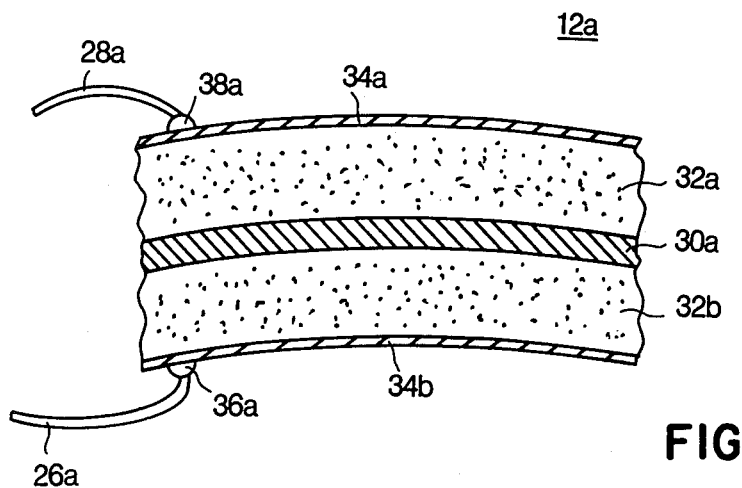
FIG. 3 is an enlarged cross-sectional view similar to FIG. 2 of an alternative embodiment having two piezoelectric layers.

Alternatively, as shown in FIG. 3, coil member 12a may include two piezoelectric layers 32a, 32b, on either side of spring 30a. Each piezoelectric layer 32a, 32b is provided with an electrode 34a, 34b on its free side which interconnects with wires 26a, 28b the solder joints 36a, 38a, respectively.

Figure 4:
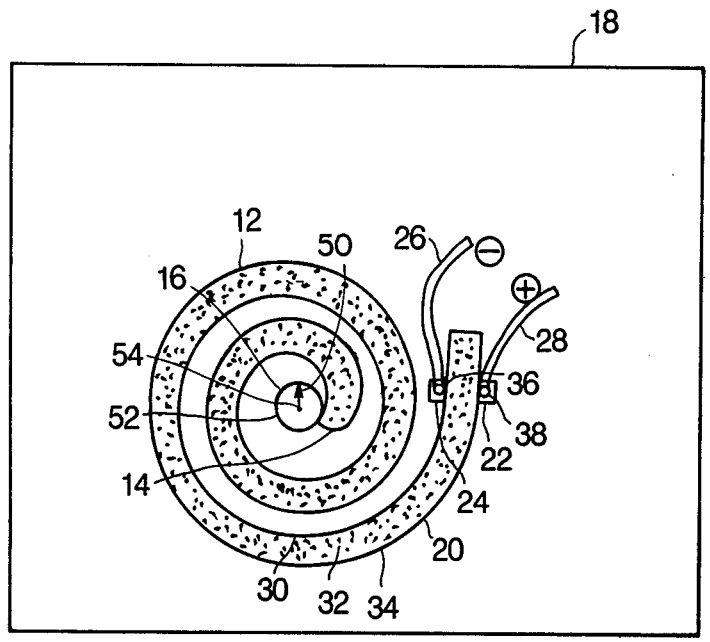
FIG. 4 is a top plan view of the rotary actuator of FIG. 1 energized to bend the coil member to the expanded state.
Figure 5:
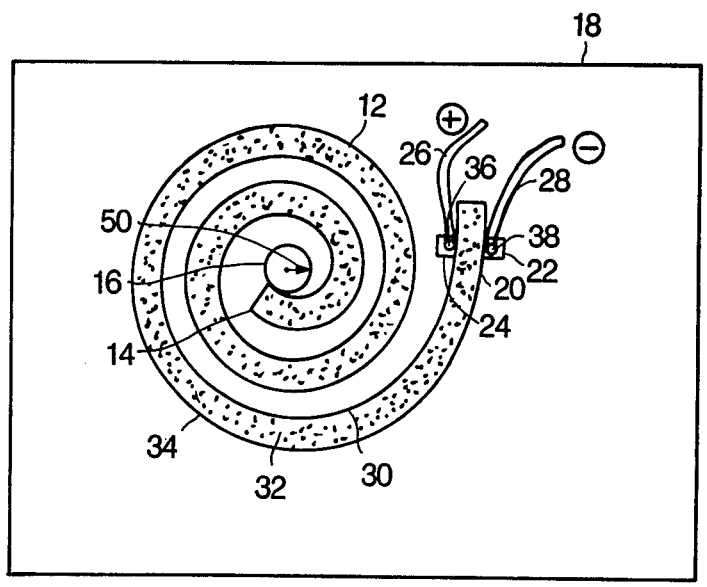
FIG. 5 is a view similar to FIG. 4 with the coil member energized to the contracted state.

In operation, an application of 300 volts-positive to wire 28, negative to wire 26, FIG. 4, coil 12 bends to the expanded position with the marker 50 on shaft 16 pointing toward the twelve o'clock position. Shaft 16 is rotatably mounted in bearing hole 52 of support plate 18 for rotation about center axis 54. A reversal of the applied voltage: the application of 300 volts positive to wire 26, negative to wire 28, FIG. 5, bends coil 12 to its contracted position and rotates shaft 16 about ninety degrees, as indicated by the new location of marker 50 at the three o'clock position.

Figure 6:
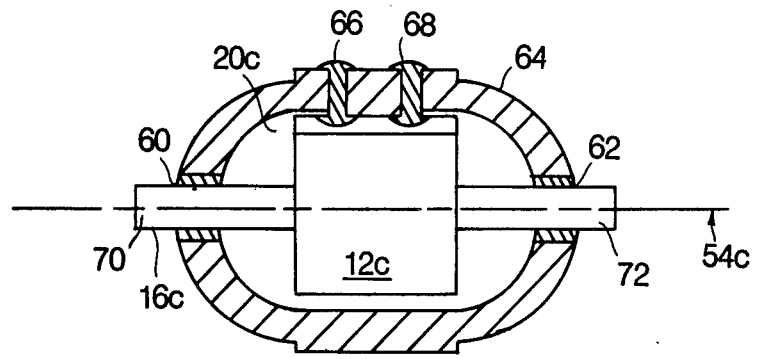
FIG. 6 is a side elevational cross-sectional view of an alternative construction of the rotary actuator according to this invention.
Figure 7:
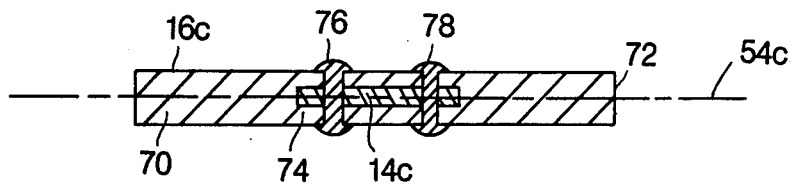
FIG. 7 is a cross-sectional view through the shaft of FIG. 6 showing the attachment of the coil member to the shaft.
Figure 8:
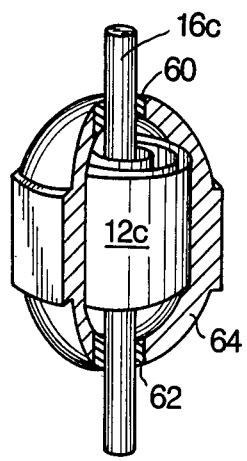
FIG. 8 is an axonometric view, partially in section, of the rotary actuator of FIG. 6.

A simple construction of a piezoelectric rotary actuator according to this invention is shown in FIG. 6, where a shaft 16c is rotatably mounted in bearings 60, 62, FIG. 8, in housing 64. Other end 20c of coil member 12c is attached to housing 64 by means of rivets 66, 68. Both ends 70, 72 extend beyond housing 64 and are accessible for attachment to equipment to be driven. Inner end 14c, FIG. 7, of coil 12c is received in slot 74 of shaft 16c and is fixed there by means of rivets 76 and 78.

Other embodiments will occur to those skilled in the art and are within the following claims:

What is claimed is:

1. A piezoelectric rotary actuator comprising: a rotatable member; a fixed member; a spiral leaf spring attached at one end to said rotatable member and at the other end to said fixed member; a piezoelectric layer attached on one side to said spiral leaf spring; and electrode means for applying a voltage across said piezoelectric layer to bend said spiral leaf spring and rotate said rotatable member.

2. The rotary actuator of claim 1 in which said rotatable member is a shaft.

3. The rotary actuator of claim 1 in which said piezoelectric layer is made of a granular piezoceramic material in an elastomeric binder.

4. The rotary actuator of claim 3 in which said elastomeric binder is vinyl.

5. The rotary actuator of claim 1 in which said electrode means includes an electrode on the free side of said piezoelectric layer and said spiral leaf spring is made of electrically conducting material and constitutes a second electrode.

6. The rotary actuator of claim 1 further including a second piezoelectric layer attached to the other side of said spiral leaf spring and said electrode means including a second electrode attached to the free side of said second piezoelectric layer.

7. The rotary actuator of claim 1 in which said spiral leaf spring is attached at its inner end to said rotatable member.

8. A piezoelectric rotary actuator comprising:
a rotatable member; a fixed member; a spiral leaf spring attached at its inner end to said rotatable member and at its outer end to said fixed member; first and second piezoelectric layers attached to opposite sides of said spiral leaf spring; and electrode means for applying a voltage across said piezoelectric layers to bend said spiral leaf spring and rotate said rotatable member.

9. The rotary actuator of claim 8 in which said rotatable member is a shaft.

10. The rotary actuator of claim 8 in which piezoelectric layer is made of a granular piezoceramic in an elastomeric binder.

11. The rotary actuator of claim 10 in which said elastomeric binder is vinyl.

12. The rotary actuator of claim 8 in which said spiral leaf spring is attached at its inner end to said rotatable member.

* * * * *